US008831054B2

(12) United States Patent
Blauvelt et al.

(10) Patent No.: US 8,831,054 B2
(45) Date of Patent: Sep. 9, 2014

(54) WAVELENGTH LOCKING OF A LASER DEVICE

(71) Applicants: Henry A. Blauvelt, San Marino, CA (US); Kerry Vahala, Pasadena, CA (US)

(72) Inventors: Henry A. Blauvelt, San Marino, CA (US); Kerry Vahala, Pasadena, CA (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 13/735,418

(22) Filed: Jan. 7, 2013

(65) Prior Publication Data

US 2014/0192830 A1    Jul. 10, 2014

(51) Int. Cl.
*H01S 3/13* (2006.01)
*H01S 3/137* (2006.01)

(52) U.S. Cl.
CPC ...................................... *H01S 3/137* (2013.01)
USPC ....................................................... 372/29.02

(58) Field of Classification Search
CPC ....................................................... H01S 5/065
USPC .......................................... 372/32, 34, 35, 36
IPC ........................................ H01S 3/09426, 3/1106
See application file for complete search history.

(56) References Cited

U.S. PATENT DOCUMENTS

| 5,748,316 | A  | * | 5/1998 | Wakabayashi et al. | ........ 356/519 |
| 6,661,818 | B1 | * | 12/2003 | Feldman et al. | ................. 372/32 |
| 2002/0075912 | A1 | * | 6/2002 | Ito et al. | ........................... 372/32 |
| 2003/0039277 | A1 | * | 2/2003 | Nasu et al. | ...................... 372/34 |
| 2003/0058907 | A1 | * | 3/2003 | Nasu et al. | ...................... 372/34 |

* cited by examiner

*Primary Examiner* — Tuan Nguyen

(57) ABSTRACT

There is discussed an optical system comprising a laser device that outputs a divergent light beam. A first portion of the divergent light beam, including a central portion, passes through an etalon device, which acts as a wavelength discriminator, and then the central portion is incident on a first monitor photodiode, which generates a wavelength-dependent detection signal. A second portion of the divergent light beam is incident on a second monitor photodetector, without passing through the etalon device, to generate a wavelength-independent detection signal. A processor processes the wavelength-dependent detection signal and the wavelength-independent detection signal to determine a control signal for controlling the wavelength of the laser device. By accurately positioning a photodetector at the central fringe of the divergent light beam following transmission through the etalon device, a compact and cost-effective wavelength locking arrangement is provided.

18 Claims, 3 Drawing Sheets

WAVELENGTH LOCKING OF A LASER DEVICE

BACKGROUND OF THE INVENTION

1. Field of the Invention

The present invention relates to optical systems including a laser device having an operational wavelength, and in particular to arrangements for locking the operational wavelength to a desired frequency. Such laser devices include semiconductor laser diodes.

2. The Background Art

Semiconductor laser diodes generally use a grating fabricated within the laser cavity to determine the operational wavelength, i.e. the wavelength at which laser operation occurs. There are several causes of drift in the operating wavelength, for example laser chip aging, thermistor aging or thermoelectric control electronics aging. Typically, when operated at constant temperature, the internal grating prevents the laser wavelength from drifting more than 0.1 nm over the course of the lifetime of the semiconductor laser diode. For some applications, such as CATV using Dense Wavelength Division Multiplexing (DWDM), this level of drift is not acceptable.

If an internal grating does not provide sufficient wavelength stability, then some form of wavelength locker is normally utilised. A wavelength locker monitors the laser wavelength and adjusts the operating temperature of the semiconductor laser diode so as to control the stability of the laser wavelength, typically to within about 0.02 nm.

FIGS. 1 and 2 show a typical implementation of wavelength locking in a laser module 1, which may be a standard 14-pin butterfly package, as discussed in the article "Wavelength Monitor Integrated CW DFB Laser Module for DWDM Applications" by Nasu et al. in the Furukawa Review, No. 23, pp 6-10 (2003). As shown in FIG. 1, the laser module 1 has a distributed feedback (DFB) laser diode 3 which outputs laser beams from both a front facet and a rear facet. The power of the laser beam output from the front facet, which forms the output of the laser module, is much higher that that output from the rear facet.

The laser beam output from the front facet of the laser diode 3 passes though a front collimating lens 5, an isolator 7 and then an objective lens 9 that couples the laser beam into an optical fiber 11. The laser beam output from the rear facet of the laser diode 3 is directed to a wavelength locking arrangement. In particular, the laser beam output from the rear facet of the laser diode 3 passes through a rear collimating lens 13 to produce a collimated light beam, and then a prism 15 which splits the collimated light beam into two diverging collimated light beams. One of the diverging collimated light beams is directly incident onto a first monitor photodiode 17 to generate a wavelength independent signal, while the other of the diverging collimated light beams is directed through an etalon 19, matched to a required operational wavelength, and subsequently onto a second monitor photodiode 21. As the light beam incident on the etalon 19 is collimated, the etalon 19 effectively acts as a narrow-band filter centred at the required operational wavelength, and accordingly the second monitor photodiode 21 generates a wavelength dependent signal.

As shown in FIG. 2, the components illustrated in FIG. 1 are mounted onto a support substrate 23, which is in turn mounted onto a thermoelectric cooler 25 which uses the Peltier effect to vary the temperature of the DFB laser diode 3 in order to vary the operational wavelength of the DFB laser diode. A processor (not shown) processes the wavelength independent signal and the wavelength dependent signal respectively produced by the first monitor photodiode 17 and the second monitor photodiode 21 to generate a control signal for the thermoelectric cooler 25 which varies the temperature of the DFB laser diode 3 to lock the operational wavelength to the required operational wavelength.

The collimating optics in the wavelength locking arrangement of FIGS. 1 and 2 increase the size of the device. U.S. Pat. No. 5,825,792 proposes a compact wavelength locker is which the laser beam output from the rear facet of a DFB laser diode passes uncollimated though an etalon. As the laser beam is uncollimated, the transmission properties of the etalon vary with the angle at which the laser beam passes through the etalon. Light passing through the etalon is directed onto two closely-spaced photodiodes. The differential output of the two photodiodes is used in a feedback loop to stabilize the operational wavelength of the DFB laser diode. This arrangement relies on the output of the two photodiodes being the same when the operational wavelength of the DFB laser diode is the required wavelength, which involves fine adjustment of the alignment and the responses of the two photodiodes.

An object of the present invention is to provide an alternative wavelength locking arrangement which is both compact and low cost.

SUMMARY OF THE INVENTION

The present invention provides an optical system comprising a laser device that outputs a divergent light beam. A first portion of the divergent light beam, including a central portion, passes through an etalon device, which acts as a wavelength discriminator, and then the central portion is incident on a first monitor photodiode, which generates a wavelength-dependent detection signal. A second portion of the divergent light beam is incident on a second monitor photodetector, without passing through the etalon device, to generate a wavelength-independent detection signal. A processor processes the wavelength-dependent detection signal and the wavelength-independent detection signal to determine a control signal for controlling the wavelength of the laser device. By accurately positioning a photodetector at the central fringe of the divergent light beam following transmission through the etalon device, a compact and cost-effective wavelength locking arrangement is provided.

In an embodiment, the first monitor photodetector and the second monitor photodetector are mounted on a common support, with the first monitor photodetector being tilted at an acute angle to the optical axis of the divergent light beam. The angle may be within the range of 5° to 10°.

DESCRIPTION OF THE PREFERRED EMBODIMENT

Details of the present invention will now be described, including aspects and embodiments thereof by way of example. The drawings are not intended to depict every feature of actual embodiments nor the relative dimensions of the depicted elements, and are not drawn to scale.

Figure 1:
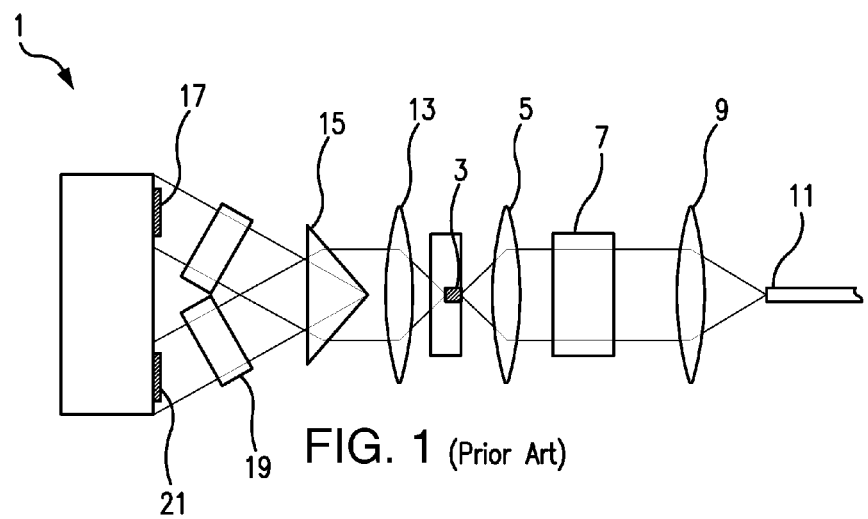
FIG. 1 shows a schematic plan view of a prior art laser diode module with wavelength locking.
Figure 2:
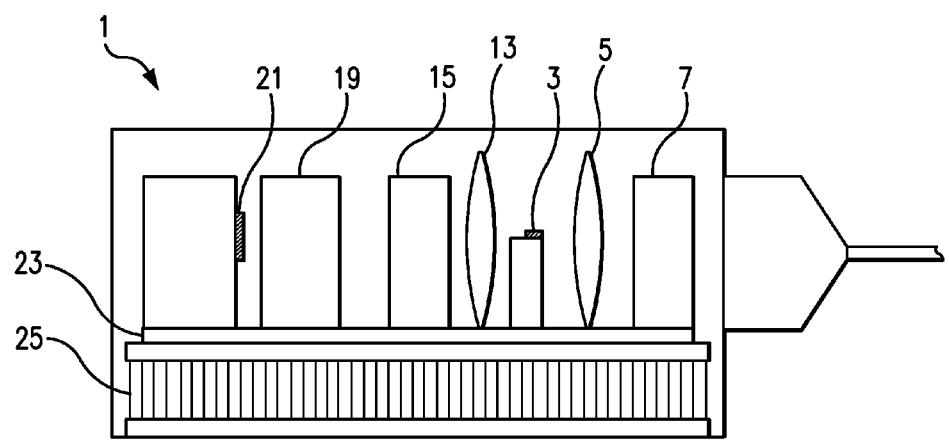
FIG. 2 shows a schematic side view of the prior art laser diode module illustrated in FIG. 1.
Figure 3:
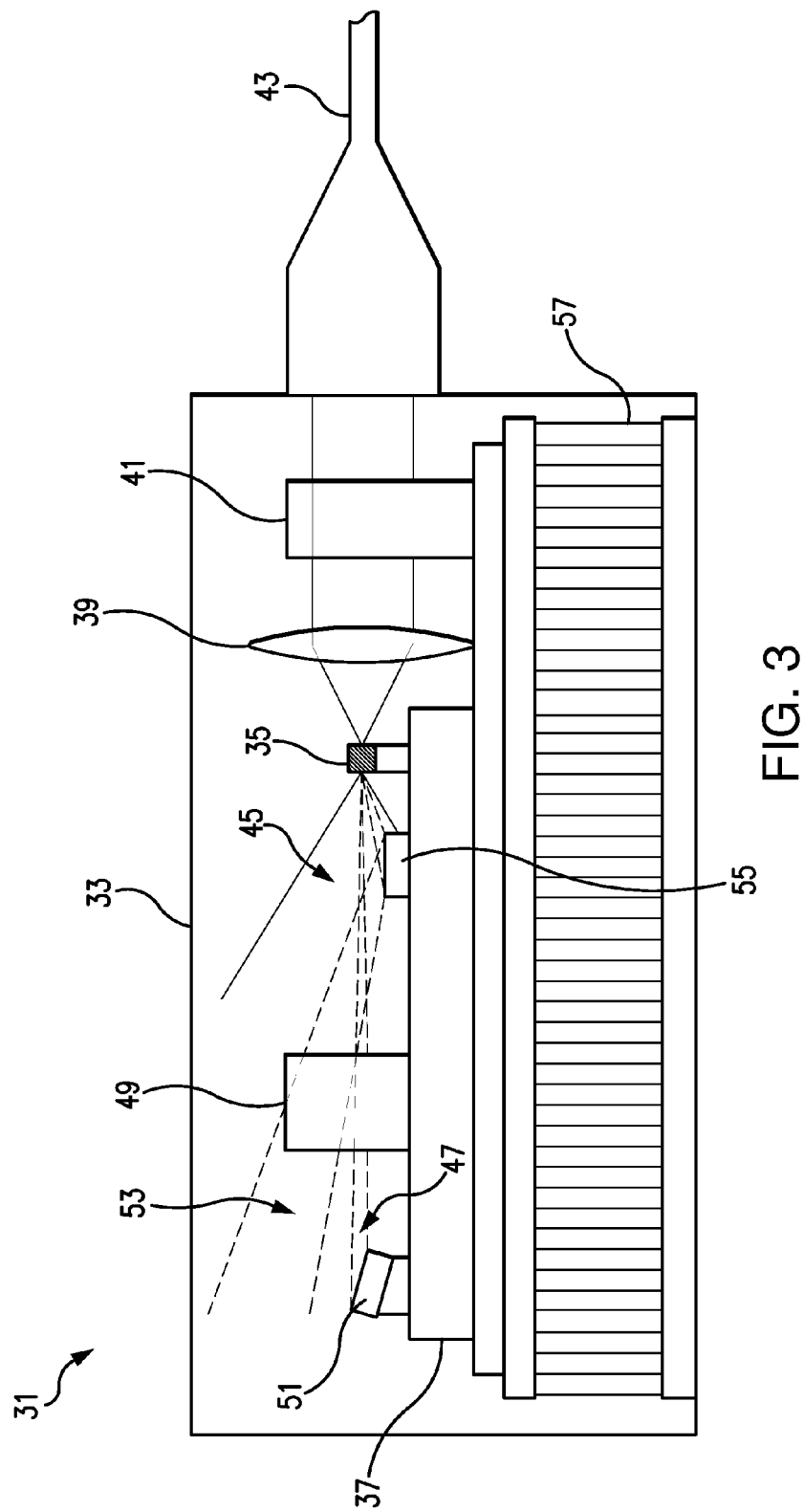
FIG. 3 shows a schematic side view of a laser diode module according to an embodiment of the present invention.
Figure 4:
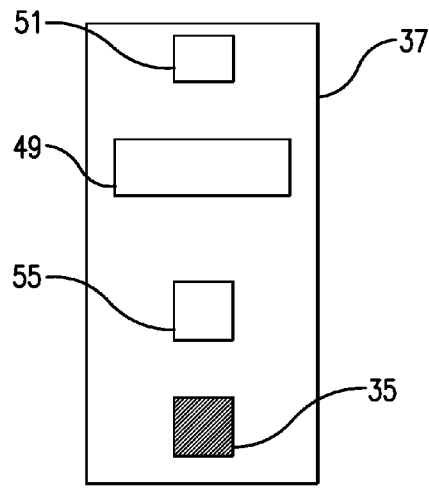
FIG. 4 shows a schematic plan view of a support forming part of the laser diode module illustrated in FIG. 3, together with components mounted on the support.

As shown in FIGS. 3 and 4, an embodiment of the present invention provides a laser module 31. In this embodiment, the packaging 33 of the laser module is a standard butterfly package. A DFB laser diode 35 is mounted on a planar substrate 37 within the packaging 33. A divergent laser beam output from a front facet of the laser diode 35 is collimated by a collimating lens 39, and then passes through an isolator 41 before being coupled into an optical fiber 43 in a conventional manner. A divergent laser beam 45 emitted from a rear facet of the laser diode 35 is input to a novel wavelength locking arrangement.

With reference to FIG. 3, a central portion 47 of the divergent laser beam 45 passes through an etalon device 49 and is incident on a first monitor photodiode 51. In this embodiment, the etalon device 49 is formed by a 500 μm thick slice of lithium niobate ($LiNbO_3$) with ¼ wave $SiO_2$ and ¼ wave Si coatings. Other embodiments may use etalons of different materials and thicknesses. The etalon device 49 is selected from a batch of fabricated etalons with different inherent wavelength peaks (due to minor differences in fabrication variables) such that the selected etalon device 49 has a variation in optical transmission with the wavelength of the central portion 47 of the laser beam has a narrow peak that closely matches the specified operational wavelength of the laser diode 35. Accordingly the first monitor photodiode 51 generates a wavelength-dependent signal that has a maximum value when the laser wavelength of the laser diode 35 matches the required operational wavelength. Generally, it is desireable that the etalon have a low temperature dependence to the refractive index, and that the refractive index be relatively high so as to permit a thinner etalon to be employed.

A second portion 53 of the divergent laser beam 45 is incident directly on a second monitor photodiode 55, without passing through the etalon device. Accordingly, the second monitor photodiode 55 generates a wavelength-independent signal.

In this embodiment, the etalon device 49, the first monitor photodiode 51 and the second monitor photodiode 53 are mounted on the same planar substrate 37 as the laser diode 35. As can be seen in FIG. 3, the first monitor photodiode 51 is mounted such that the detecting surface of the first monitor photodiode is tilted at a small angle, preferably in the range of 5° to 10°, to the plane of the planar substrate 37. The first monitor photodiode 51 has a small area detecting surface, and the tilting of this detecting surface has the effect of reducing still further the solid angle of the central portion 47 of the divergent light beam 45 detected by the first monitor photodiode 51, which is advantageous as this results in the transmission of the etalon device 49 being more constant over the central portion 47 of the divergent light beam 45. In this embodiment, the divergent light beam 45 output by the laser diode 35 is centred at an optical axis which runs parallel to the planar surface of the planar substrate 37, and the central portion 47 of the divergent light beam 45 is centred on this optical axis.

The second monitor photodiode 55 is mounted on the planar substrate 37 between the diode laser 35 and the etalon device 49, with a detecting surface of the second monitor photodiode 55 being parallel to the planar surface of the planar substrate 37. The optical axis of the divergent light beam 45 passes over the second monitor photodiode 55 so that the central portion 47 of the divergent light beam 45 is not incident on the second monitor photodiode 55. In this embodiment, the perpendicular distance between the detecting surface of the second monitor photodiode 55 and the optical axis is in excess of 40 μm. The second portion 53 of the divergent light beam 45, which is incident on the detecting surface of the second monitor photodiode 55, is centered away from the axis of the divergent light beam 45. Part of the second portion 53 of the divergent light beam 45 reflects off the detecting surface of the second monitor photodiode 55 and, as shown in FIG. 3, passes through the etalon device 49 and then passes over the first monitor photodiode 51 without impinging the detecting surface of the first monitor photodiode 51. In this way, it is ensured that the first monitor photodiode 51 only detects the central portion 47 of the divergent light beam 45 and the second monitor photodiode 55 only detects the second portion 53 of the divergent light beam 45.

The planar substrate 37, the collimating lens 39 and the isolator 41 are mounted on a thermoelectric cooler (TEC) 57, which can vary the temperature of the laser diode 35 to vary the operating wavelength.

Figure 5:
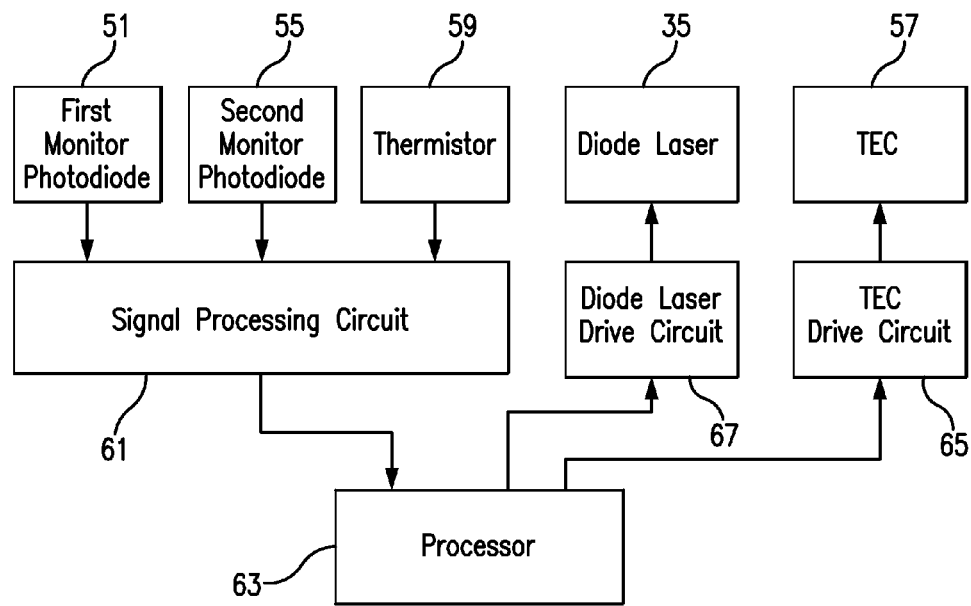
FIG. 5 is a block diagram schematically showing electrical components of the laser diode module illustrated in FIG. 3.

FIG. 5 schematically shows electrical components of the laser module 31 together with associated electrical circuitry. The wavelength-dependent signal generated by the first monitor photodiode 51 and the wavelength-independent signal generated by the second monitor photodiode 55, along with a temperature signal from a thermistor 59 within the packaging 33, are converted into corresponding digital signals by a signal processing circuit 61 before being forwarded to a processor 63. The processor 63 processes the wavelength-dependent signal and the wavelength-independent signal to determine a normalised wavelength-dependent signal. Based on the history of the normalised wavelength-dependent signal, and utilising the temperature signal, the processor generates a control signal that is transmitted to a TEC control circuit 65 to control the temperature of the diode laser 35 so that the required operational wavelength is obtained. The TEC control circuit 65 then sends corresponding drive signals to the TEC 57. The processor 63 also sends control signals to a diode laser drive circuit 67, which sends drive signals to the diode laser 35.

The manufacture of the laser module 31 involves requires the positioning of the diode laser to an accuracy of approximately 10 μm. In order to assist this positioning, alignment marks may be provided on the laser substrate. In addition, the etalon 49 needs to be placed with a rotational accuracy of approximately 0.5°. This can be achieved using a suitable alignment fixture.

A DFB diode laser 35 is used in the above embodiment. The wavelength-locking arrangement of the invention can equally well be applied with other types of laser device, including other forms of semiconductor diode laser or a Ti:sapphire laser. While the main application for the wavelength locking arrangement of the present invention is anticipated as being in DWDM optical communication systems, the techniques could alternatively be used in other applications requiring a laser beam having a very stable wavelength, for example in an atomic clock.

Similarly, although photodiodes are used to detect the light in the above embodiment, other forms of photodetector could be used, for example a phototransistor.

The thermoelectric cooler 57 can raise the temperature of the diode laser 35 above ambient temperature as well as lower the temperature of the diode laser 35 below ambient temperature. As such, the term "thermoelectric cooler" covers any device that can change the temperature of the diode laser 35 in response to an applied electrical signal, including those operating based on the Peltier effect.

The invention claimed is:

1. An optical system comprising:
a laser device operable to output a divergent light beam is centered about an optical axis;
an etalon device arranged to receive and filter a first uncollimated portion of the divergent light beam;
a first monitor photodetector positioned to substantially exclude any fringe pattern of the light beam transmitted through the etalon device and to detect only a central portion of the first uncollimated portion of the divergent light beam, following filtering by the etalon device and to generate a wavelength-dependent detection signal, wherein the first monitor photodetector is tilted at an angle to the optical axis; and
a second monitor photodetector operable to detect a second uncollimated portion of the divergent light beam, said second uncollimated portion travelling from the laser device to the second monitor photodetector without passing through the etalon device and to generate a wavelength-independent detection signal.

2. The optical system of claim 1, further comprising a processor operable to process the wavelength-dependent detection signal and the wavelength-independent detection signal to determine a control signal for controlling the wavelength of the laser device.

3. The optical system of claim 1, further comprising a thermoelectric cooler operable to vary the temperature of the laser device in response to said control signal.

4. The optical system of claim 1, wherein the first monitor photodetector and the second monitor photodetector are mounted on a common support.

5. The optical system of claim 1, wherein said angle is within the range of 5° to 10°.

6. The optical system of claim 1, wherein the laser device, the first photodetector, the etalon device and the second photodetector are mounted on a substrate, and
wherein the second photodetector is positioned between the laser device and the etalon device.

7. The optical system of claim 6, wherein the laser device is arranged such that the optical axis is parallel to the substrate, and the perpendicular distance between the optical axis and the substrate is greater than the height of the second photodetector above the substrate.

8. The optical system of claim 7, wherein the second photodetector has an active detection surface parallel to a planar surface of the substrate.

9. The optical system of claim 1, wherein the laser device is a semiconductor diode laser.

10. An optical module comprising:
housing;
a laser device positioned in the housing and operable to output a divergent light beam is centered about an optical axis;
an optical fiber output arrangement configured to receive a front portion of the divergent light beam for coupling the front portion of the divergent light beam to an optical fiber; and
a wavelength locking arrangement configured to receive a rear portion of the divergent light beam for locking the operational wavelength of the laser device to a selected frequency, wherein the wavelength locking arrangement does not comprise a collimating lens, wherein the wavelength locking arrangement comprises:
an etalon device arranged to receive and filter a first portion of the rear portion of the divergent light beam;
a first monitor photodetector positioned to substantially exclude any fringe pattern of the light beam transmitted through the etalon device and to detect only a central portion of the first portion of the rear portion of the divergent light beam, following filtering by the etalon device and to generate a wavelength-dependent detection signal, wherein the first monitor photodetector is tilted at an angle to the optical axis; and
a second monitor photodetector operable to detect a second portion of the rear portion of the divergent light beam, said second portion travelling from the laser device to the second monitor photodetector without passing through the etalon device and to generate a wavelength-independent detection signal.

11. The optical module of claim 10, wherein the housing comprises a butterfly housing.

12. The optical module of claim 10, further comprising a thermoelectric cooler operable to vary the temperature of the laser device.

13. The optical module of claim 10, wherein the first monitor photodetector and the second monitor photodetector are mounted on a planar surface of a common support.

14. The optical module of claim 10, wherein said angle is within the range of 5° to 10°.

15. The optical module of claim 10, wherein the laser device, the first photodetector the etalon device and the second photodetector are mounted on a substrate, and
wherein the second photodetector is positioned between the laser device and the etalon device.

16. The optical module of claim 15, wherein the laser device is arranged such that the optical axis is parallel to the substrate, and the perpendicular distance between the optical axis and the substrate is greater than the height of the second photodetector above the substrate.

17. The optical module of claim 16, wherein the second photodetector has an active detection surface parallel to a planar surface of the substrate.

18. The optical module of claim 10, wherein the laser device is a semiconductor diode laser.

* * * * *